United States Patent [19]

Devlin

[11] Patent Number: 4,794,607
[45] Date of Patent: Dec. 27, 1988

[54] OPTO-ELECTRONIC DEVICES

[75] Inventor: William J. Devlin, Ipswich, United Kingdom

[73] Assignee: British Telecommunications public limited company, United Kingdom

[21] Appl. No.: 869,770

[22] Filed: Jun. 2, 1986

[30] Foreign Application Priority Data

Jun. 4, 1985 [GB] United Kingdom ............... 8514051

[51] Int. Cl.[4] .................................... H01S 3/18
[52] U.S. Cl. ...................... 372/49; 372/52; 357/17; 351/166; 330/4.3
[58] Field of Search ............ 372/49, 52; 330/4.3; 357/17; 351/166

[56] References Cited

U.S. PATENT DOCUMENTS

| | | | |
|---|---|---|---|
| 4,337,443 | 6/1982 | Umeda et al. | 372/49 |
| 4,387,960 | 6/1983 | Tani | 350/164 |
| 4,638,334 | 1/1987 | Burnham et al. | 346/108 |

FOREIGN PATENT DOCUMENTS

| | | | |
|---|---|---|---|
| 0140096 | 12/1984 | European Pat. Off. | |
| 1056301 | 3/1986 | Japan | 351/166 |

OTHER PUBLICATIONS

Heitmann; Reactively Evaporated Films of Scandia and Yttia; Feb. 1973; pp. 394-397.
Patents Abstracts of Japan, vol. 7, No. 140 (E-182) 1285, Jun. 18, 1983; & JP A 58 54 691 (Hitachi Seisakusho K.,.) 31.03.1983.
Applied Physics Letters, vol. 46, No. 2, Jan. 15, 1985, pp. 133-135, American Institute of Physics, New York, US; R. H. Rediker et al.: "Operation of Individual Diode Lasers as a Coherent Ensemble Controlled by a Spatial Filter within an External Cavity", p. 134.
Applied Physics Letters, vol. 45, No. 12, Dec. 15, 1984, pp. 1314-1316, American Institute of Physics, New York, US; J. Hegarty et al: "High Speed Modulation and Switching with Gain in a GaAlAs Traveling-Wave Optical Amplifier", p. 1315, left-hand column, first paragraph.
Patents Abstracts of Japan, vol. 7, No. 218 (E-200) 1363, 28.09.1983; & JP-A-58 111 386 (Hitachi Seisakusho K.K.) 02.07.1983.
Applied Physics Letters, vol. 44, No. 5, Mar. 1, 1984, pp. 481-483, American Institute of Physics, London, GB; P-L. Lui et al: "Measurements of Intensity fluctuations of an InGaAsP", p. 481.

*Primary Examiner*—William L. Sikes
*Assistant Examiner*—Xuan T. Vo
*Attorney, Agent, or Firm*—Nixon & Vanderhye

[57] ABSTRACT

An optical amplifier takes the form of a semiconductor laser with coatings on its two facets. The coating takes the form of an anti-reflective coating, e.g. an oxide of Y, Gd, Nd, or La, to reduce the reflectivity and a thin interlayer, e.g. $Al_2O_3$, to enhance compatibility between the laser and the anti-reflective coating.

20 Claims, 1 Drawing Sheet

OPTO-ELECTRONIC DEVICES

BACKGROUND OF THE INVENTION

This invention relates to opto-electronic devices and, in particular, to optical amplifiers obtained by coating the facets of a laser with anti-reflection coating.

Semiconductor lasers are well known devices which are used to generate light. Their operation depends upon the reflection of light generated by the device back into the device. It is also desired to utilise a "laser" to amplify a received optical signal. In this application it is desired that the device shall respond only to the received signal and in order to achieve or get close to this result it is necessary to eliminate as far as it is possible the reflection of light back into the device.

For this purpose, anti-reflection coatings are applied to the facets of the laser and a wide variety of metal oxides have been proposed for these coatings, e.g. $Al_2O_3$, $Sc_2O_3$, $ZrO_2$ and $CeO_2$. Our copending U.S. application Ser. No. 741,867 filed June 6, 1985 derived from UK patent application No. 8414454 state that oxides of Y, Gd, Nd and La give particularly good results.

SUMMARY OF THE INVENTION

We have realised that some metal oxide coatings fail to display their full potential as anti-reflection coatings. In addition we have, most surprisingly, found that the incorporation of a thin interlayer between the effect coating and the semiconductor device substantially enhances the performance.

The interlayer should provide a complete cover between the laser and the effect coating but it should be so thin that, by itself, it would have little or no effect on the optical properties of the coated device. It is surprising that such thin layers exert a substantial effect. Furthermore the material used for interlayer may be less effective as an anti-reflection coating than the material of the effect coating. Therefore it would be expected that, even if such a thin layer should produce a noticeable effect, that effect would be detrimental whereas it is substantial and beneficial.

The invention is particularly suitable for use where the effect coating is composed of oxides of Y, Gd, Nd or La and the substrate is a laser such as indium-gallium arsenide-phosphide laser. In this case we have found that $Al_2O_3$ is particulary suitable as the interlayer. The thickness of the interlayer is preferably 10 l to 30 nm e.g. 15 to 25 nm in absolute terms. In relative terms the interlayer is 5% to 15%, e.g. about 10%, of the thickness of the effect coating.

BRIEF DESCRIPTION OF THE DRAWINGS

An example of the invention will now be described by way of example with reference to the accompanying drawings in which.

DESCRIPTION OF THE PREFERRED EMBODIMENTS

In accordance with the invention a conventional indium-gallium arsenide-phosphate laser was provided with an effect coating of $Gd_2O_3$ with a thin interlayer of $Al_2O_3$ between the laser and the $Gd_2O_3$. These layers were applied using the apparatus illustrated in FIG. 1.

Figure 1:
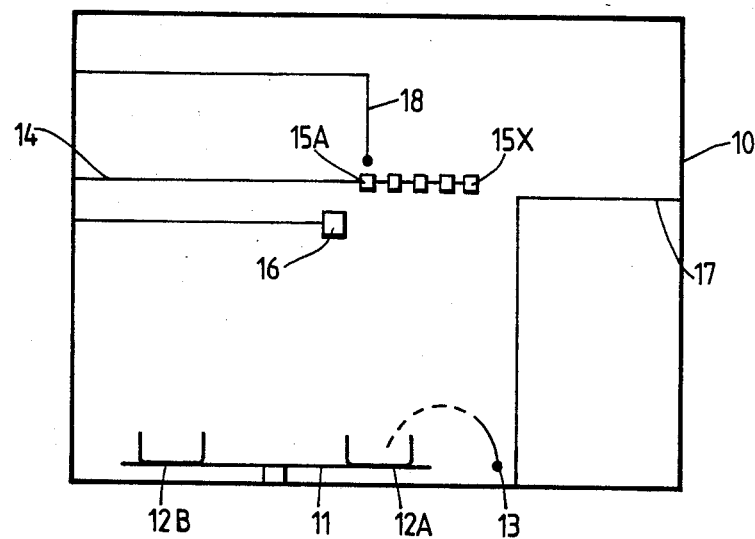
FIG. 1 illustrates, in diagrammatic form, the apparatus used to apply the coatings.

The apparatus shown in FIG. 1 comprises a low pressure chamber 10 which contains all items of coating equipment. During use the chamber 10 is evacuated to $10^{-6}$ torr (i.e. 133 micropascals). The chamber 10 is constructed to withstand this vacuum. Conventional control and electric power lines pass in and out of the chamber 10 but these are not shown in any drawing.

The source of coating takes the form of a rotatable carousel 11, controllable from outside chamber 10, upon which copper hearths 12A and 12B, containing $Al_2O_3$ (to make the interlayer) and $Gd_2O_3$ (to make the effect coating) respectively, are located. The chamber 10 also contains an electron gun 13 to generate an electron beam which is focussed by magnets (not shown) onto the hearth in the active position (i.e. hearth 12A as shown). The hearths are loaded into chamber 10 by means not shown in any drawing.

The chamber also contains a target holder 14 into which a plurality of targets 15A–15X, i.e. lasers in this example, can be located. Each target is oriented with the desired facet for coating downwards and a second facet, passive in this process, upwards. Coating is uniform for all targets in a useable zone which is large enough to contain up to 60 separate targets if desired. Thus, with the acceptable tolerance limits, the chamber 10 can be used to coat 60 items in a single latch.

As well as the targets 15 the chamber 10 contains a quartz crystal 16 which is also mounted in the useful zone. The crystal 16 is used to monitor the thickness of coatings. There is also a shutter 17, controllable from outside the chamber, which can be interposed in the beam to prevent deposition (e.g. at the end of the process) on the targets 15 and the crystal 16.

In addition to the crystal 16 one of the targets, namely 15A, is associated with a radiation sensor 18 positioned to receive radiation from the passive facet. Target 15A is provided with excitation means not shown in any drawing.

In use a plurality of indium-gallium arsenide-phosphide lasers were mounted in holder 14 and hearths 12A and 12B were placed in position. After the chamber has been evacuated, the electron beam was switched on. This evaporated $Al_2O_3$ which condensed on all the targets 15 to produce the interlayer. The $Al_2O_3$ also deposited on crystal 16. When 20 nm of $Al_2O_3$, as indicated by quartz crystal 16, had deposited (on all targets) the hearts 12A and 12B were interchanged. This placed the $Gd_2O_3$ in the electron beam whereby this compound evaporated and condensed on all targets to produce the effect coating. This coating was terminated at maximum effect as monitored by sensor 18. The two monitoring processes will now be described.

Crystal 16 is caused to oscillate and the frequency of its oscillation is monitored outside the chamber. Since the crystal is in the useful zone vapour from the hearth-in-use condenses on it to give a coating of the same thickness as on all targets. The presence of the coating affects the frequency of oscillation of the crystal 16 and, by using a calibrated crystal, the frequency shift provides an instantaneous measure of the thickness of coating on the crystal whereby the growth of the coating on the crystal 16 can by followed. Since the thickness of the coating on the crystal 16 is the same as the thickness on all targets 15, the thickness of the coatings of $Al_2O_3$ on the targets can be controlled to 20 nm.

The sensor 18 provides a control which is directly related to the performance of the target 15. Thus, if the laser 15A is subjected to constant excitation, a constant aount of radiation is produced. This constant amount leaves via the intended and passive facets. The purpose of the effect layer is to obtain maximum emission at the intended face and this corresponds to minimum emission at the passive face (as recorded by sensor 18).

Figure 2:
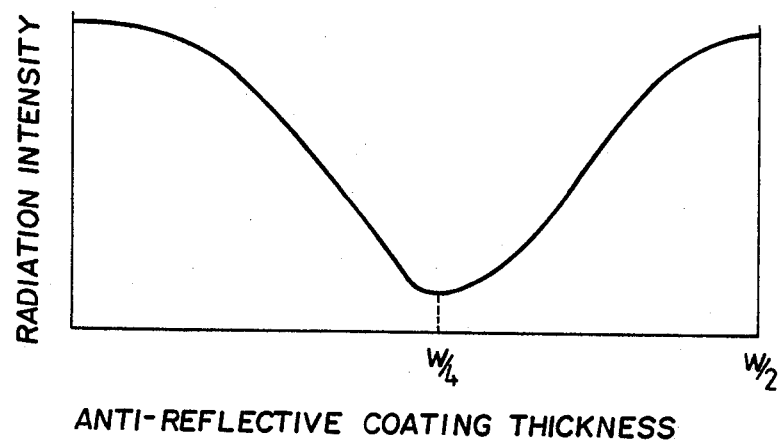
FIG. 2 shows, in identical form, a signal used to monitor the coating process.

FIG. 2 shows the intensity which would be recorded at constant excitation by sensor 18 on coating from zero thickness up to w/2 thickness where w is the wavelength of the radiation in the coating.

As can be seen the intensity remains constant for very thin layers and then it falls to a minimum at w/4. For thicker coatings the intensity recorded by sensor 18 increases until it returns to its original value at w/2. The optimum end point for the coating is at w/4. Thus the "best" process would comprise depositing $Gd_2O_3$ until the sensor 18 gives a minimum reading and terminating he deposition at the exact minimum. However, the precise minimum is hard to detect and, to make sure it is reached, we prefer to overshoot by a negligible amount. Thus we prefer to terminate as soon as a rising intensity is noticed.

(The changes of intensity indicated by FIG. 2 are beyond the capacity of most detectors. This gives rise to a difficulty which can be overcome by increasing the excitation current to compensate for a low intensity. A series of stepwise increases is preferred).

Using the techniques outlined above an indium-gallium arsenide-phosphide laser was given an effect coating of $Gd_2O_3$ 200 nm thick with an interlayer of $Al_2O_3$ 20 nm thick. The deposition of the $Al_2O_3$ was controlled by quartz crystal 16. The $Gd_2O_3$ was coated to optimum thickness as indicated by passing the minimum displayed by sensor 18, ie using the technique described above.

It was found that this coating suppressed laser activity to such an extent that it was not practical to assess reflectivities or assign a laser threshold.

For routine production, it is suggested that the thickness of the effect coating also be controlled by quartz crystal 16, as is conventional. However the quartz crystal 16 is calibrated, using sensor 18 as described above, so that optimum thickness corresponding to minimum reflectivity is applied.

What is claimed is:

1. An opto-electronic device having a faceted optical substrate which, on at least one of its facets, has a composite coating effective to reduce the reflectivity of said facet, wherein said composite coating includes an anti-reflective coating and an interlayer disposed between the substrate facet and the anti-reflective coating for improving the chemical compatibility between the anti-reflective coating and the substrate, said interlayer being less than 30 nm thick.

2. A device according to claim 1, wherein the interlayer is 10 to 30 nm thick.

3. A device according to claim 2, in which the interlayer is 15 to 25 nm thick.

4. A device according to claim 1, in which the thickness of the interlayer is 5% to 15% of the thickness of the anti-reflective coating.

5. A device according to claim 4, wherein the thickness of the interlayer is 10% of the thickness of the anti-reflective coating.

6. A device according to claim 1, in which the anti-reflective coating is composed of oxides of Y, Gd, Nd or La.

7. A device according to claim 6, in which the anti-reflective coating is formed of $Gd_2O_3$.

8. A device according to claim 6, in which the interlayer is composed of $Al_2O_3$.

9. An optical amplifier comprising as substrate a semiconductor laser device having two facets adapted for the reception and emission of radiation wherein each of said facets is in contact with an anti-reflection coating effective to reduce its reflectivity and thereby adapted to enhance the amplification function by suppressing optical feedback and related optical oscillation, wherein each coating comprises an anti-reflective layer to reduce reflectivity and an interlayer located between said anti-reflecting layer and said laser device, said interlayer being less than 30 nm thickness adapted to improve the chemical compatibility between said anti-reflective layer and said device.

10. An optical amplifier according to claim 9, wherein the interlayer is 10 to 30 nm thick and the interlayer is between 5% and 15% of the thickness of the anti-reflective layer.

11. An optical amplifier according to claim 9, wherein the interlayer is composed of $Al_2O_3$ and the anti-reflective layer is composed of oxides of Y, Gd, Nd or La.

12. An optical amplifier comprising as substrate a semiconductor laser device having two facets adapted for the reception and emission of radiation wherein each of said facts is in contact with an anti-reflection coating effective to reduce it reflectivity and thereby adapted to enhance the amplification function by suppressing optical feeback and related optical oscillation, wherein each coating comprises an anti-reflective layer composed of oxides of Y, Gd, Nd or La to reduce reflectivity and an interlayer composed of $Al_2O_3$ located between said anti-reflective layer and said laser device, said interlayer being 10 to 30 nm thick and between 5% and 15% of the thickness of said anti-reflection layer.

13. An optical amplifier according to claim 12, wherein the anti-reflective layer is composed of $Gd_2O_3$.

14. An optical amplifier comprising as substrate a semiconductor laser device having two facets adapted for the reception and emission of radiation wherein each of said facets is in contact with an anti-reflection coating effective to reduce its reflectivity and thereby adapted to enhance the amplification function by suppressing optical feedback and related optical oscillation, wherein each coating comprises an anti-reflection layer composed of $Gd_2O_3$ to reduce reflectivity and an interlayer composed of $Al_2O_3$ located between said anti-reflection layer and said laser device, said anti-reflection layer being 150 to 250 nm thick and said interlayer being 10% of the thickness of said anti-reflection coating.

15. An optical amplifier according to claim 14, wherein the substrate is an indium-gallium arsenide-phosphide laser.

16. An opto-electronic device having a faceted optical substrate which, on at least one of its facets has a composite coating effective to reduce the reflectivity of said facet, wherein said composite coating includes an anti-reflective coating and an interlayer located between said anti-reflective coating and said facet, said interlayer being a substantially complete layer of less than 30 nm thickness which, by itself, is too thin to exert a substantial effect on the reflectivity of said facet.

17. An optical amplifier comprising as substrate a semiconductor laser device having two facets adapted for the reception and emission of radiation, wherein each of said facets is in contact with a composite coating effective to reduce the reflectivity of said facet and thereby enhance the amplification of the device by reducing optical feedback and related optical oscillation, wherein each of said composite coatings include an anti-reflective coating and an interlayer located between said anti-reflective coating and said facet, said interlayer being less than 30 nm thickness a substantially complete layer which, by itself, is tool thin to exert a substantial effect on the reflectivity of said facet.

18. An amplifier according to claim 17 in which the anti-reflective coating is adjusted to the thickness of substantially minimum reflectivity.

19. An amplifier according to claim 18, in which the anti-reflective coating is composed of $Gd_2O_3$ and the interlayer is composed of $Al_2O_3$.

20. An optical amplifier according to any one of claims 17, 18 or 19, wherein the substrate is an indium-gallium arsenide-phosphate laser.

* * * * *